(12) United States Patent
Yamasaki et al.

(10) Patent No.: US 7,344,754 B2
(45) Date of Patent: Mar. 18, 2008

(54) FILM FORMATION METHOD

(75) Inventors: Hideaki Yamasaki, Nirasaki (JP);
Tatsuo Hatano, Nirasaki (JP); Yumiko Kawano, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 11/155,575

(22) Filed: Jun. 20, 2005

(65) Prior Publication Data

US 2005/0233079 A1    Oct. 20, 2005

Related U.S. Application Data

(63) Continuation of application No. PCT/JP03/16190, filed on Dec. 17, 2003.

(30) Foreign Application Priority Data

Dec. 18, 2002  (JP) .............................. 2002-367073

(51) Int. Cl.
*C23C 16/00* (2006.01)
*B05D 3/00* (2006.01)

(52) U.S. Cl. ................. 427/250; 427/299; 427/255.11

(58) Field of Classification Search ..................... None
See application file for complete search history.

(56) References Cited

U.S. PATENT DOCUMENTS

| | | | | |
|---|---|---|---|---|
| 5,834,372 A * | 11/1998 | Lee | ............................. | 438/677 |
| 5,856,236 A * | 1/1999 | Lai et al. | .................... | 438/681 |
| 5,861,189 A * | 1/1999 | Sheel et al. | .................. | 427/166 |
| 5,906,866 A * | 5/1999 | Webb | .......................... | 427/534 |
| 6,025,269 A * | 2/2000 | Sandhu | ........................ | 438/688 |
| 6,095,085 A * | 8/2000 | Agarwal | .............. | 118/723 MP |
| 6,117,772 A * | 9/2000 | Murzin et al. | .............. | 438/677 |
| 6,218,301 B1* | 4/2001 | Yoon et al. | .................. | 438/685 |
| 6,445,023 B1* | 9/2002 | Vaartstra et al. | ............ | 257/295 |
| 6,635,965 B1* | 10/2003 | Lee et al. | .................... | 257/758 |
| 6,905,543 B1* | 6/2005 | Fair et al. | ...................... | 117/89 |
| 6,998,014 B2* | 2/2006 | Chen et al. | ............ | 156/345.34 |

FOREIGN PATENT DOCUMENTS

JP            59-209642         11/1984

(Continued)

OTHER PUBLICATIONS

Sugai et al. aluminum chemical vapor deposition with new gas phase pretreatment using tetrakisdimethylamino-titanium for ultralasrge-scale integrated-circuit metalization, J. Vac. Sci. Technol. B 13(5), 1995.*

*Primary Examiner*—Timothy Meeks
*Assistant Examiner*—David Turocy
(74) *Attorney, Agent, or Firm*—Oblon, Spivak, McClelland, Maier & Neustadt, P.C.

(57) ABSTRACT

A method of forming a metal film using a metal carbonyl compound as a material is disclosed that includes the steps of: (a) introducing a reactive gas into a space near a surface of a substrate to be processed; and (b) introducing a gaseous phase material including the metal carbonyl compound into the space on the surface of the substrate to be processed, and depositing the metal film on the surface of the substrate to be processed after step (a). Step (a) is executed in such a manner as to prevent substantial deposition of the metal film on the substrate to be processed.

11 Claims, 13 Drawing Sheets

FOREIGN PATENT DOCUMENTS

| | | |
|---|---|---|
| JP | 10-135452 | 5/1998 |
| JP | 2002-124488 | 4/2002 |
| JP | 2005-505690 | 2/2005 |
| WO | WO 02/079537 A2 | 10/2002 |
| WO | WO 03/031679 A2 | 4/2003 |

* cited by examiner

FILM FORMATION METHOD

CROSS-REFERENCE TO RELATED APPLICATION

This application is a U.S. continuation application filed under 35 U.S.C. 111(a) claiming benefit under 35 U.S.C. 120 and 365(c) of PCT International Application No. PCT/JP03/16190, filed on Dec. 17, 2003, which claims priority to Japanese Patent Application No. 2002-367073, filed on Dec. 18, 2002. The entire contents of the foregoing applications are hereby incorporated by reference.

BACKGROUND OF THE INVENTION

1. Field of the Invention

The present invention relates generally to manufacture of semiconductor devices, and more particularly to a method of forming a metal film by CVD using a metal carbonyl material.

2. Description of the Related Art

Conventionally, chemical vapor deposition (CVD), which is a basic manufacturing process of semiconductor devices and allows film formation with good coverage even on a complicated structure having a high aspect ratio, is widely used for deposition of insulating films, semiconductor films, or metal films in the process of manufacturing semiconductor devices and display units such as liquid crystal display units.

In particular, the thermal CVD technology of metal films using a metal carbonyl material, which enables a film of refractory metal such as W to be formed with low resistance and, in addition, directly also on insulating films such as a $SiO_2$ film, is important in multilayer interconnection structure technologies (see, for instance, Patent Document 1 and Patent Document 2).

Conventionally, deposition of a W film by thermal CVD is performed using a material such as $WF_6$ or $WCl_6$ and reducing this using $H_2$, $SiH_4$, or $NH_3$. However, these methods have a problem in that it is difficult to deposit a W film on insulating films such as a $SiO_2$ film.

On the other hand, the technique of forming a W film on a $SiO_2$ film, using, for instance, $W(CO)_6$ as a gaseous phase material, by a thermal decomposition reaction $W(CO)_6 \rightarrow W+6CO$ is proposed.

Such W film deposition by CVD using $W(CO)_6$ as a material is typically performed in a temperature area of approximately 500° C. under pressures at or below approximately 7 Pa (0.5 Torr). Under these conditions, deposition of a W film occurs immediately on a $SiO_2$ film with the start of the processing, and it is possible to form a high-quality W film with efficiency, that is, with high throughput. Here, the start of the processing is a timing at which supply of the gaseous phase material starts onto a substrate.

[Patent Document 1] Japanese Laid-Open Patent Application No. 10-135452

[Patent Document 2] Japanese Laid-Open Patent Application No. 2002-124488

FIG. 1 shows the relationship between deposition time and the film thickness of a formed W film, which was found by the inventors of the present invention when W film deposition was performed at low substrate temperatures at or below 500° C. using $W(CO)_6$ as a gaseous phase material in experimental studies that form the basis of the present invention. In the experiment of FIG. 1, W film deposition was performed at a substrate temperature of 413° C. under a pressure of approximately 8 Pa (0.06 Torr) by supplying $W(CO)_6$, with Ar gas bubbling of a flow rate of 50 SCCM, from a material container maintained at 25° C. to a reaction container (processing container). Here, the deposition time refers to a processing time that elapses from a timing at which supply of the gaseous phase material starts onto a substrate.

Referring to FIG. 1, it is found that deposition of a W film on a substrate does not occur immediately after the start of processing, and that it starts only after the passage of an incubation time of approximately 300 seconds, that is, approximately 5 minutes. After the passage of the incubation time, the film thickness of a W film increases linearly with deposition time.

The relationship of FIG. 1 shows that it is possible to form a W film on a $SiO_2$ film with good accuracy even at such a low temperature by controlling deposition time. However, the existence of such incubation time at the start of processing reduces the throughput of a W film formation process. In particular, in a single-wafer film formation process that processes large-diameter substrates one by one, a wait time corresponding to the incubation time is generated for each substrate, thus causing a serious decrease in throughput in the entire manufacturing process of semiconductor devices. This incubation time further increases as the substrate temperature at the time of deposition is further reduced, and may reach 600 seconds or more. For instance, in the case of forming a W film by thermal decomposition of $W(CO)_6$, setting the bubbler temperature at 30° C. and the flow rate of a gaseous phase material including $W(CO)_6$ at 50 SCCM at a substrate temperature of 338° C. under 0.1 Torr, it has been found by the inventors of the present invention that an incubation time of 618 seconds, that is, more than 10 minutes, is generated although the deposition rate itself realizes a desired value of approximately 6.6 nm per minute.

SUMMARY OF THE INVENTION

Accordingly, it is a general object of the present invention to provide a novel and useful film formation method in which the above-described disadvantage is eliminated.

A more specific object of the present invention is to provide a method of forming a metal film by CVD using a metal carbonyl material which method improves the efficiency of substrate processing by reducing incubation time at the time of film formation through introduction of a reactive gas into a space near the surface of a substrate to be processed.

The above objects of the present invention are achieved by a method of forming a metal film using a metal carbonyl compound as a material, including the steps of: (a) introducing a reactive gas into a space near a surface of a substrate to be processed; and (b) introducing a gaseous phase material including the metal carbonyl compound into the space on the surface of the substrate to be processed, and depositing the metal film on the surface of the substrate to be processed after step (a), wherein step (a) is executed in such a manner as to prevent substantial deposition of the metal film on the substrate to be processed.

According to the present invention, in a method of forming a metal film by CVD using a metal carbonyl material, by introducing a reactive gas into a space near the surface of a substrate to be processed, it is possible to improve substrate processing efficiency by reducing incubation time at the time of film formation, and further, to improve the adhesion of the formed film to a base film.

BRIEF DESCRIPTION OF THE DRAWINGS

Other objects, features and advantages of the present invention will become more apparent from the following detailed description when read in conjunction with the accompanying drawings, in which.

DETAILED DESCRIPTION OF THE PREFERRED EMBODIMENTS

Next, a description is given, with reference to the drawings, of embodiments of the present invention.

[Principles]

Figure 1:
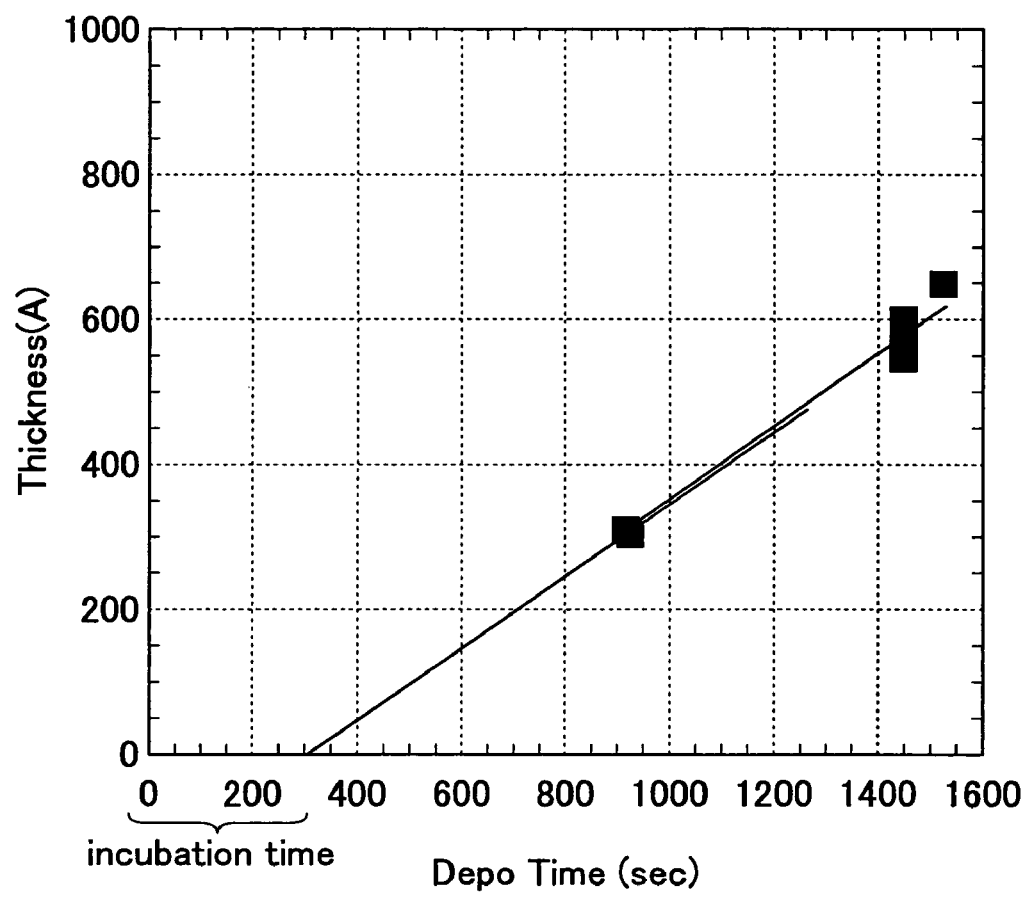
FIG. 1 is a diagram showing the relationship between the film thickness of a W film and deposition time in the case of depositing the W film directly on an insulating film by CVD.
Figure 2:
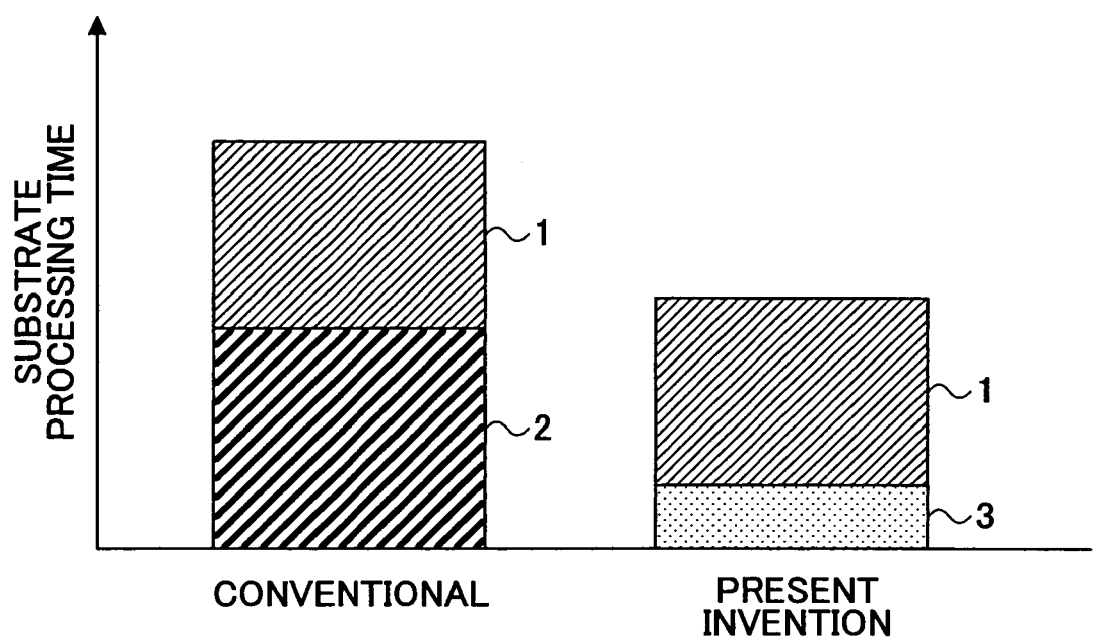
FIG. 2 is a diagram showing substrate processing time in the conventional case and the present invention.

FIG. 2 shows substrate processing time in the conventional case and the present invention.

Referring to FIG. 2, first, in the conventional case, the substrate processing time is made up of a film formation time 1 and an incubation time 2. As described above, incubation time, in which no W film deposition occurs, exists immediately after the start of processing. This lengthens the substrate processing time, causing a decrease in productivity. On the other hand, the substrate processing time according to the present invention is made up of the film formation time 1 and a pretreatment time 3. According to the present invention, incubation time is reduced by performing substrate pretreatment in starting W film deposition. As a result, substrate processing time is reduced, so that productivity is improved.

Next, a description is given of a CVD apparatus performing the W film deposition and a substrate processing apparatus performing the substrate pretreatment.

First Embodiment

Figure 3:
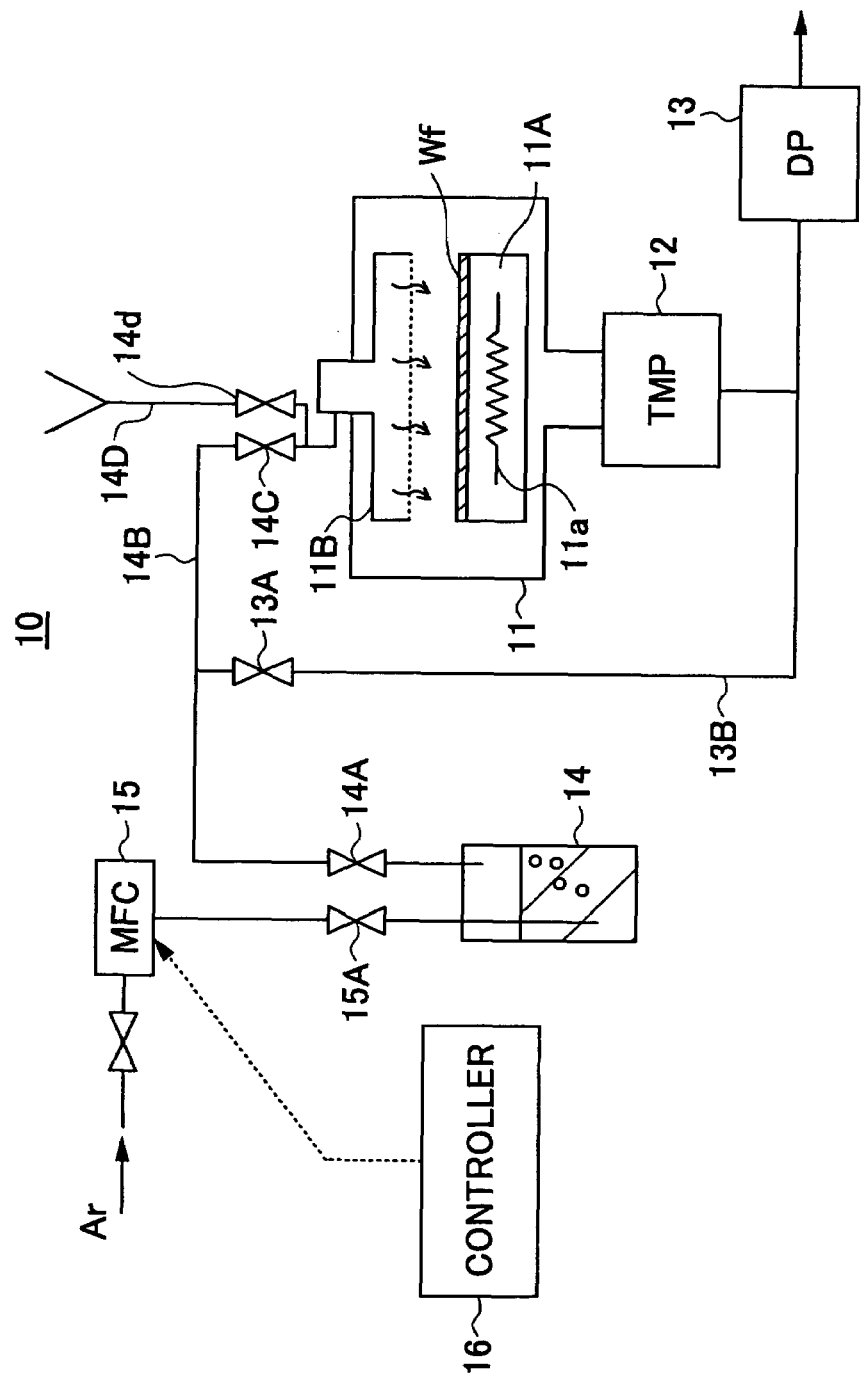
FIG. 3 is a diagram showing a configuration of a CVD apparatus performing substrate processing according to the present invention.

FIG. 3 shows a CVD apparatus used in a first embodiment of the present invention.

Referring to FIG. 3, the CVD apparatus 10 includes a processing container 11 evacuated by a turbo molecular pump (TMP) 12 and a dry pump (DP) 13. A substrate holding table 11A for holding a substrate to be processed Wf is provided in the processing container 11. A heater 11a is embedded in the substrate holding table 11A. This structure makes it possible to heat the substrate to be processed Wf to a desired temperature.

Further, a shower head 11B for introducing a process gas is provided on the processing container 11. From a bubbler 14 holding $W(CO)_6$, which is a solid material, $W(CO)_6$, together with a carrier gas of Ar or the like, is supplied as a gaseous phase material to the shower head 11B through a valve 14A, a line 14B, and a valve 14C provided in the line 14B. Thus supplied $W(CO)_6$ is introduced from the shower head 11B to the processing container 11 as indicated by arrows in the drawing so as to undergo a thermal decomposition reaction on the surface of the substrate to be processed Wf. As a result, a decomposed W film is deposited on an insulating film formed on the surface of the substrate to be processed Wf.

Further, a gas line 14D to which a valve 14d is provided is connected to the shower head 11B. The gas line 14D is connected to a gas supply source not graphically illustrated. This makes it possible to fill the processing container 11 with an inert gas by supplying Ar, He, or $N_2$, which are inert gases, and to control pressure inside the processing container 11 using the inert gas if necessary.

Further, a bypass line 13B, which connects the line 14B to the dry pump 13 through a valve 13A, is provided to the CVD apparatus 10 of FIG. 3. The valve 13A is closed in a normal film formation step. However, for instance, in the case of causing a carrier gas including a material to flow outside the processing container 11 before film formation so as to stabilize flow rate, or in the case of purging the processing container 11, the valve 13A is opened, and at the same time, the valve 14C is closed. As a result, during such a flow rate stabilizing operation, a gaseous phase material formed in the bubbler 14 is discharged directly to the dry pump 13. This makes it possible to keep the state of the bubbler 14 constant during a deposition process, during a flow rate stabilizing operation, and also during a purging process.

In this embodiment, a carrier gas composed of Ar or the like is supplied to the bubbler 14 through a mass flow rate controller 15 and a valve 15A, so that bubbling is caused. At this point, by controlling the mass flow rate controller 15 with a system controller 16, it is possible to control the density of $W(CO)_6$ in the gaseous phase material supplied to the processing container 11.

Figure 4:
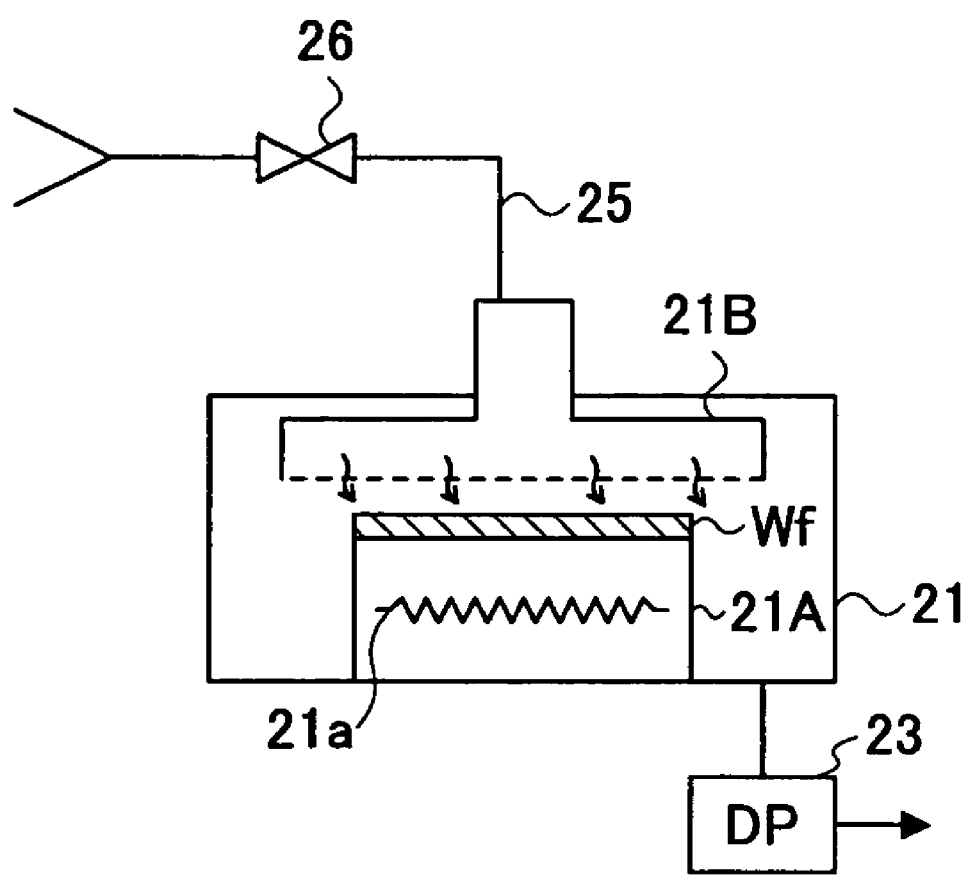
FIG. 4 is a diagram showing a configuration of a substrate processing apparatus performing substrate processing according to the present invention.

Next, a substrate processing apparatus 20, which is an example substrate processing apparatus performing the substrate pretreatment is shown in FIG. 4.

Referring to FIG. 4, the substrate processing apparatus 20 includes a processing container 21 evacuated by a dry pump (DP) 23. A substrate holding table 21A for holding the substrate to be processed Wf is provided in the processing container 21. A heater 21a is embedded in the substrate holding table 21A. This structure makes it possible to heat the substrate to be processed Wf to a desired temperature.

Further, a shower head 21B for introducing a process gas is provided on the processing container 21. A line 25 with a valve 26 is connected to the shower head 21B so that a gas necessary for substrate pretreatment is supplied.

Further, in actual substrate processing, substrate pretreatment is performed in the substrate processing apparatus 20, and thereafter, deposition of a W film is performed in the CVD apparatus 10. At this point, the substrate to be processed Wf is transferred under reduced pressure. For instance, it is transferred in a vacuum using a cluster tool apparatus not graphically illustrated.

Figure 5:
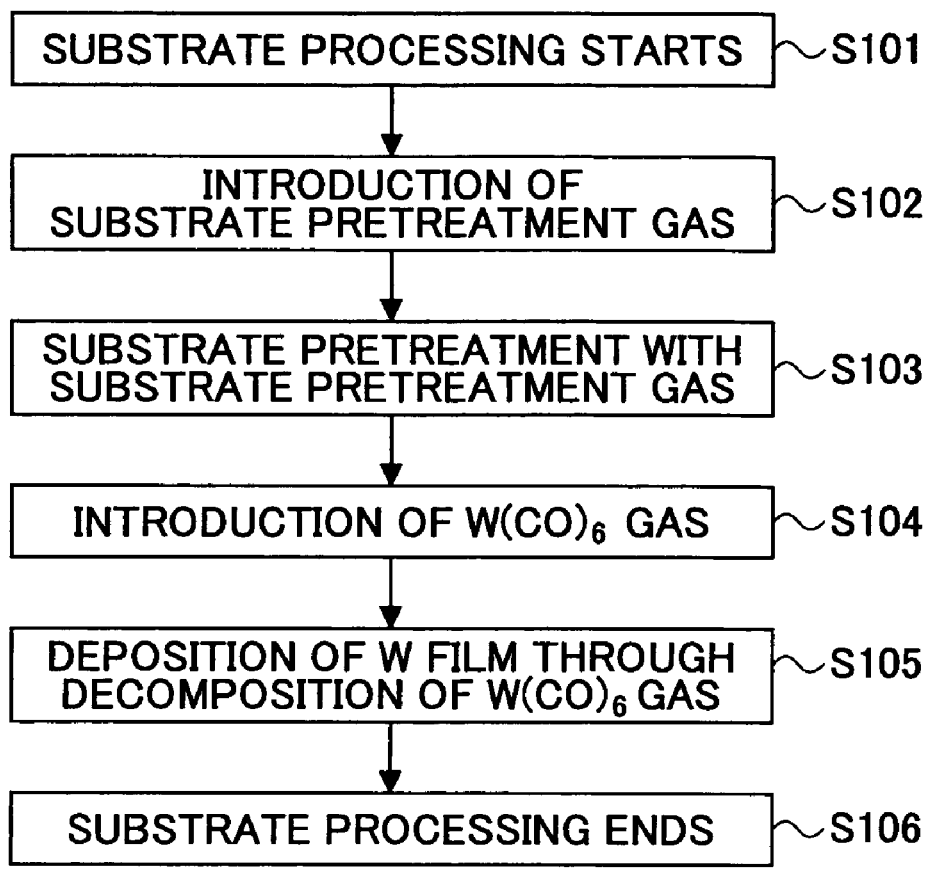
FIG. 5 is a diagram showing a substrate processing method according to the present invention.

Next, a description is given, using the process flowchart of FIG. 5, of a specific method of substrate processing performed using the substrate processing apparatus 20 and the CVD apparatus 10.

Referring to FIG. 5, the substrate processing shown in FIG. 5 is made up of step S101 (denoted as S101 in the drawing, the same holding in the following) through step S106.

First, in step S101, the substrate to be processed Wf having a silicon oxide film formed on its surface is placed on the substrate holding table 21A of the substrate processing apparatus 20. The temperature of the substrate to be processed Wf is maintained at 380° C. by the heater 21a, and substrate processing is started.

Next, in step S102, the valve 26 of the substrate processing apparatus 20 is opened so that 30 sccm of organic Ti gas such as TDEAT ($Ti[N(C_2H_5)_2]_4$), which is a substrate pretreatment gas, is introduced together with dilute Ar gas, and in step S103, substrate pretreatment is performed, holding it for 60 seconds at a pressure of 1 Torr. In this case, since Ti easily reacts with the base silicon oxide film, TDEAT is adsorbed on the surface of the silicon oxide film and decomposed. As a result, nuclei for W film formation to be performed in the next process are formed, thus producing the effect of facilitating W film deposition. Further, the reaction of Ti with the silicon oxide film also improves adhesion. Since Ti has low resistance, it is possible to keep the resistance of a formed film low.

When the substrate pretreatment is thus completed, the substrate to be processed Wf is transferred to the CVD apparatus 10. The substrate to be processed Wf is placed on the substrate holding table 11A, and is maintained at 415° C. by the heater 11a.

Next, in step S104, the mass flow rate controller 15 is controlled with the system controller 16 so that an Ar carrier gas is supplied at a flow rate of 300 SCCM to the bubbler 14 maintained at a temperature of 40° C.

As a result, the same supersaturation state of $W(CO)_6$ molecules as in the case of normal thermal CVD occurs in a space near the silicon oxide film formed on the surface of the substrate to be processed Wf, and in step S105, a W film grows on the substrate Wf so as to cover the silicon oxide film at a film formation rate of 3.2 nm/min.

Then, after deposition of a desired W film is completed, the substrate processing ends in step S106.

The W film thus formed has nuclei including Ti formed as described above, and deposition of the W film occurs with the nuclei serving as starting points. Therefore, incubation time as described above is eliminated, so that deposition of the W film starts at the same time that $W(CO)_6$ is supplied. Accordingly, substrate processing time is reduced, so that productivity is improved. Further, formation of the nuclei improves adhesion of the formed W film to the silicon oxide film. An adhesion test is conducted by a tape test method shown below in FIGS. 6 and 7.

Figure 6:
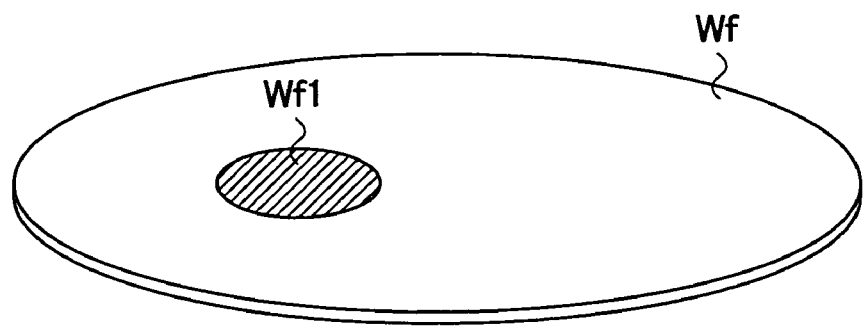
FIG. 6 is a diagram showing a tape test method that is an adhesion test.
Figure 7:
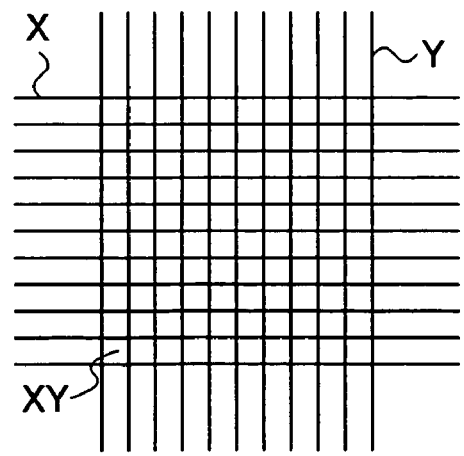
FIG. 7 is a diagram showing the tape test method that is an adhesion test.

A test part Wf1 of the substrate to be processed Wf on which a W film is formed is shown in FIG. 6. An enlarged view of the test part Wf1 is FIG. 7. Referring to FIG. 7, 11 horizontal notch lines indicated by X are drawn in FIG. 7.

The notch lines are scratches formed on the W film using a marking-off pin or a diamond cutter. Likewise, 11 vertical notch lines Y are drawn so as to be perpendicular to the notch lines X. As a result, 100 test pieces indicated by XY are formed. A test that attaches an adhesive tape to and detaches it from an area including the 100 test pieces XY is conducted. The adhesion of the W film is evaluated by the number of W film test pieces XY adhering to the adhesive tape to be detached from the substrate to be processed Wf or the silicon oxide film. This adhesion evaluation method may be referred to as a tape test method.

The adhesion of the W film formed by the method of the first embodiment was evaluated by the tape test method. As a result, it was possible to confirm excellent adhesion with no test piece XY being detached from the substrate to be processed Wf or the silicon oxide film.

In this embodiment, TDEAT ($Ti[N(C_2H_5)_2]_4$) is used as organic Ti gas. However, the gas is not limited to this, and the same effects can be achieved by using, for instance, TDMAT ($Ti[N(CH_3)_2]_4$).

Further, besides organic Ti gas, a boron compound gas may be used as a substrate pretreatment gas. The boron compound gas facilitates formation of nuclei serving as starting points of deposition at the time of deposition of a W film. Further, its resistance is low even when it remains inside the film. Accordingly, it is useful as a substrate pretreatment gas. In this embodiment, in the case of using gas including boron or a gaseous phase material including boron, such as $BF_3$, $B_2H_6$, or $B(C_2H_5)_3$, in place of organic Ti gas, the same effects as in the case of using organic Ti gas can be achieved. Further, organic Ti gas including boron may be used as a substrate pretreatment gas.

Second Embodiment

The substrate processing method shown in FIG. 5 is enabled to perform substrate pretreatment and W film deposition successively in a substrate processing apparatus 10A shown below in FIG. 8.

Figure 8:
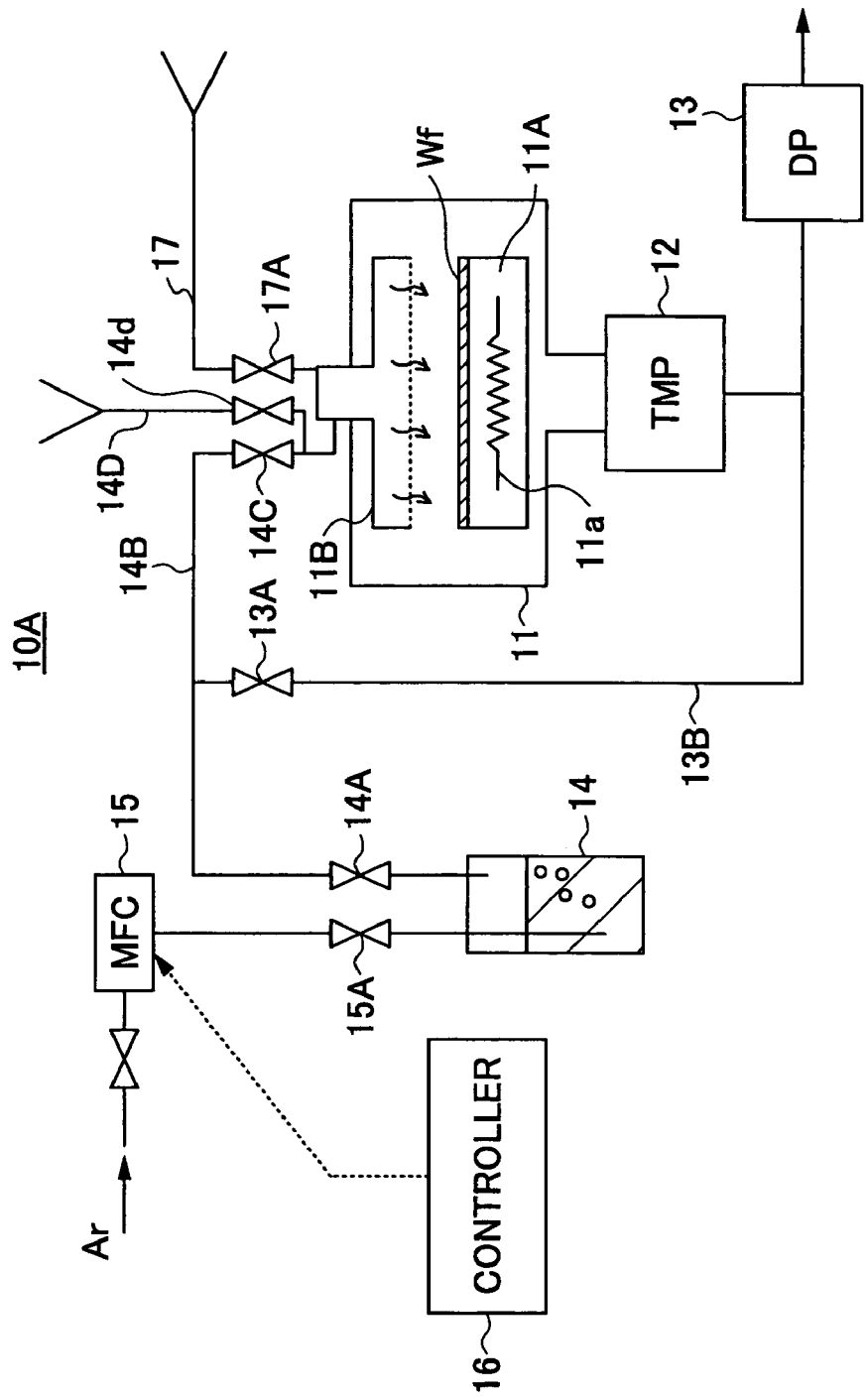
FIG. 8 is a diagram showing a configuration of a substrate processing apparatus performing substrate processing according to the present invention.

FIG. 8 shows the substrate processing apparatus 10A that can successively perform the substrate pretreatment and W film deposition shown in FIG. 5. In the drawing, the parts described above are assigned the same reference numerals, and a description thereof is omitted.

Referring to FIG. 8, the substrate processing apparatus 10A is formed by connecting a line 17 with a valve 17A to the shower head 11B of the CVD apparatus 10. The line 17, which is connected to a gas supply source not graphically illustrated, supplies gas necessary for substrate pretreatment to the substrate processing apparatus 10A through the shower head 11B.

Next, the substrate processing method shown in FIG. 5 using the substrate processing apparatus 10A is shown below specifically.

First, in step S101, the substrate to be processed Wf having a silicon oxide film formed on its surface is placed on the substrate holding table 11A of the substrate processing apparatus 10A. The temperature of the substrate to be processed Wf is maintained at 380° C. by the heater 11a, and substrate processing is started.

Next, in step S102, the valve 17A of the substrate processing apparatus 10A is opened so that 30 sccm of organic Ti gas such as TDEAT ($Ti[N(C_2H_5)_2]_4$), which is a substrate pretreatment gas, is introduced together with dilute Ar gas, and in step S103, substrate pretreatment is performed, holding it for 60 seconds at a pressure of 1 Torr. In this case, since Ti easily reacts with the base silicon oxide film, TDEAT is adsorbed on the surface of the silicon oxide film and decomposed. As a result, nuclei for W film formation to be performed in the next process are formed, thus producing the effect of facilitating W film deposition. Further, the reaction of Ti with the silicon oxide film also improves adhesion. Since Ti has low resistance, it is possible to keep the resistance of a formed film low.

When the substrate pretreatment is thus completed, supply of the substrate pretreatment gas including dilute Ar gas is stopped, and the processing container 11 is evacuated. The substrate to be processed Wf is maintained at 415° C. by the heater 11a.

Next, in step S104, the mass flow rate controller 15 is controlled with the system controller 16 so that an Ar carrier gas is supplied at a flow rate of 300 SCCM to the bubbler 14 maintained at a temperature of 40° C.

As a result, the same supersaturation state of $W(CO)_6$ molecules as in the case of normal thermal CVD occurs in a space near the silicon oxide film formed on the surface of the substrate to be processed Wf, and in step S105, a W film grows on the substrate Wf so as to cover the silicon oxide film at a film formation rate of 3.2 nm/min.

Then, after deposition of a desired W film is completed, the substrate processing ends in step S106.

As in the case of the first embodiment, incubation time is eliminated for the W film thus formed, and deposition of the W film starts at the same time that $W(CO)_6$ is supplied. Further, excellent adhesion of the formed W film to the silicon oxide film can be achieved, and it was also possible to confirm excellent adhesion in the tape test with no test piece XY being detached from the substrate to be processed Wf or the silicon oxide film.

Further, also in this embodiment, the same effects can be achieved by using, for instance, TDMAT ($Ti[N(CH_3)_2]_4$) as organic Ti gas as a substrate pretreatment gas.

Further, besides organic Ti gas, a boron compound gas may be used as a substrate pretreatment gas. The boron compound gas facilitates formation of nuclei serving as starting points of deposition at the time of deposition of a W film. Further, its resistance is low even when it remains inside the film. Accordingly, it is useful as a substrate pretreatment gas. In this embodiment, in the case of using gas including boron or a gaseous phase material including boron, such as $BF_3$, $B_2H_6$, or $B(C_2H_5)_3$, in place of organic Ti gas, the same effects as in the case of using organic Ti gas can be achieved. Further, organic Ti gas including boron may be used as a substrate pretreatment gas.

Third Embodiment

Figure 9:
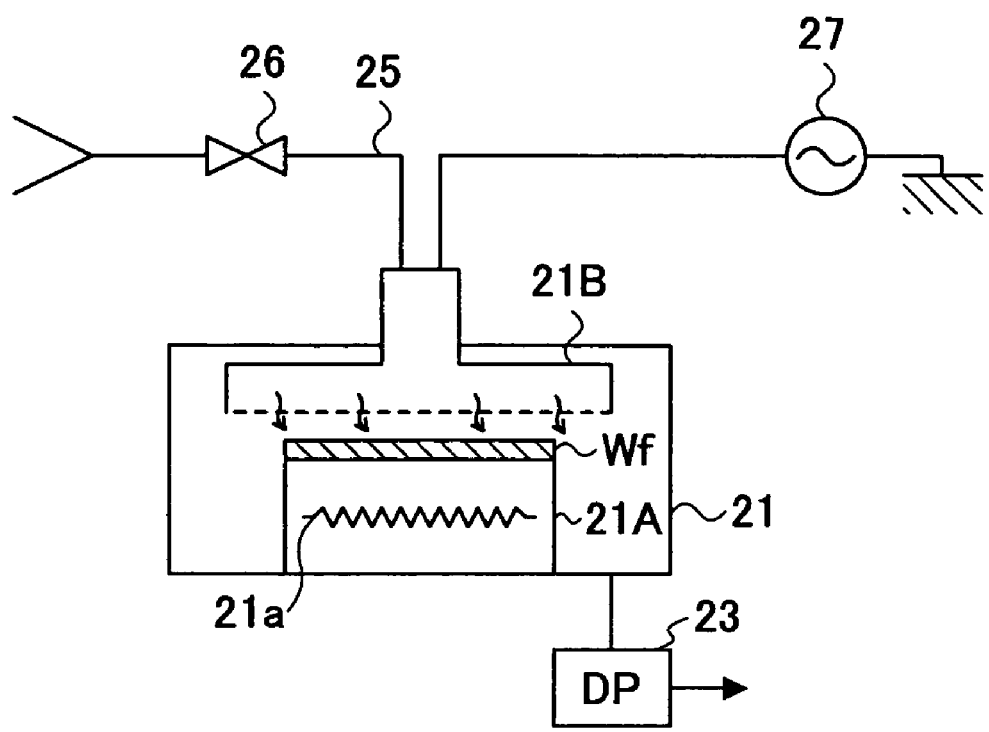
FIG. 9 is a diagram showing a configuration of a substrate processing apparatus performing substrate processing according to the present invention.

Next, as a third embodiment, a substrate processing apparatus 30 is shown in FIG. 9 as an example substrate processing apparatus performing substrate pretreatment. In the drawing, the parts described above are assigned the same reference numerals, and a description thereof is omitted.

Referring to FIG. 9, the substrate processing apparatus 30 is structured so as to be able to apply a high frequency with a high frequency application device 27 being connected to the shower head 21B of the substrate processing apparatus 20. The shower head 21B for introducing a process gas is provided on the processing container 21. The line 25 with the valve 26 is connected to the shower head 21B so that gas necessary for substrate pretreatment is supplied. This structure is equal to that of the substrate processing apparatus 20.

The substrate processing apparatus 30 is structured so as to be able to perform substrate pretreatment by exciting plasma by applying a high frequency to the shower head 21B after introduction of gas necessary for the substrate pretreatment.

Further, in actual substrate processing, substrate pretreatment is performed in the substrate processing apparatus 30, and thereafter, deposition of a W film is performed in the CVD apparatus 10. At this point, the substrate to be processed Wf is transferred under reduced pressure. For instance, it is transferred in a vacuum using a cluster tool apparatus not graphically illustrated.

Figure 10:
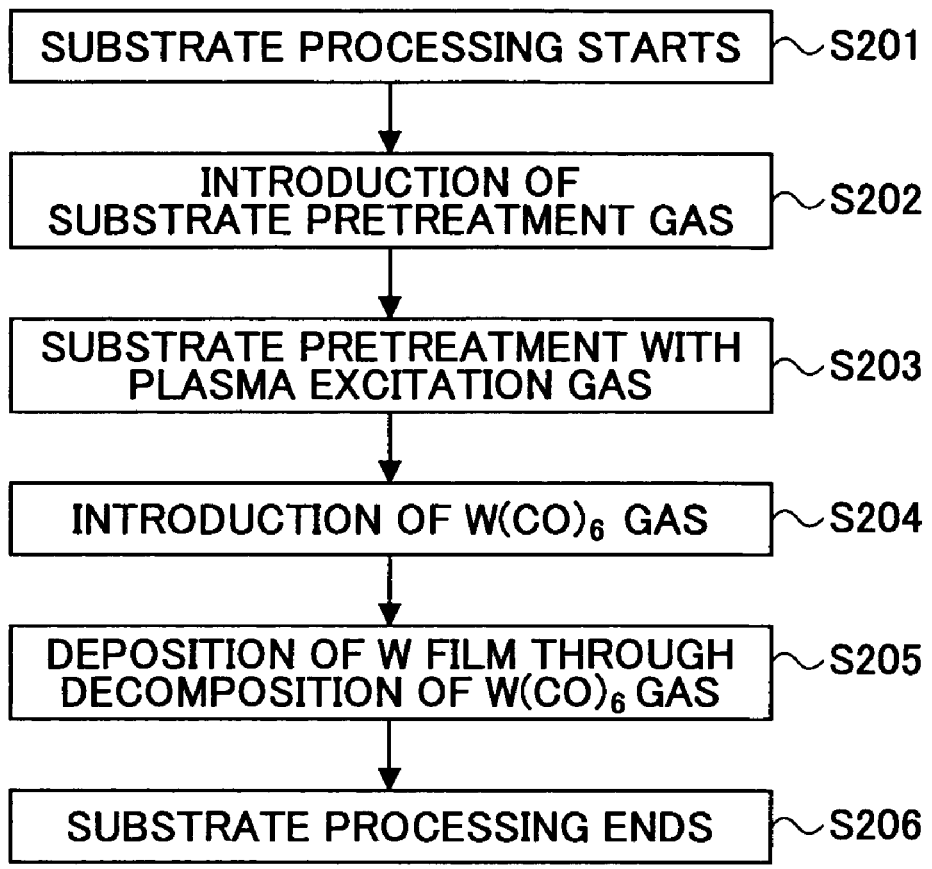
FIG. 10 is a diagram showing a substrate processing method according to the present invention.

A specific substrate processing method actually performed using the substrate processing apparatus 30 and the CVD apparatus 10 is shown in FIG. 10.

Referring to FIG. 10, the substrate processing shown in FIG. 10 is made up of step S201 (denoted as S201 in the drawing, the same holding in the following) through step S206.

First, in step S201, the substrate to be processed Wf having a silicon oxide film formed on its surface is placed on the substrate holding table 21A of the substrate processing apparatus 30. The temperature of the substrate to be processed Wf is maintained at 395° C. by the heater 21a, and substrate processing is started.

Next, in step S202, the valve 26 of the substrate processing apparatus 30 is opened so that 500 sccm of an inert gas used for substrate pretreatment, such as Ar, is introduced. Then, in step S203, plasma is excited by applying a high frequency from the high frequency application device 27 at a pressure of 0.5 Torr. Substrate pretreatment is performed holding, for 120 seconds, this state where the plasma is excited. In this case, $Ar^+$ (Ar ions) generated by the plasma collides with the silicon oxide film formed on the surface of the substrate to be processed Wf, so that Si—O bonds are broken in a part. In the part, Si dangling bonds are formed. The dangling bonds serve as starting points in subsequent deposition of a W film, so that it is possible to reduce incubation time in depositing the W film. Further, since bonding with Si is strengthened, it is also possible to improve the adhesion of the W film to the silicon oxide film.

When the substrate pretreatment is thus completed, the substrate to be processed Wf is transferred to the CVD apparatus 10. The substrate to be processed Wf is placed on the substrate holding table 11A, and is maintained at 420° C. by the heater 11a.

Next, in step S204, the mass flow rate controller 15 is controlled with the system controller 16 so that an Ar carrier gas is supplied at a flow rate of 300 SCCM to the bubbler 14 maintained at a temperature of 35° C.

As a result, the same supersaturation state of $W(CO)_6$ molecules as in the case of normal thermal CVD occurs in a space near the silicon oxide film formed on the surface of the substrate to be processed Wf, and in step S205, a W film grows on the substrate Wf so as to cover the silicon oxide film at a film formation rate of 2.4 nm/min.

Then, after deposition of a desired W film is completed, the substrate processing ends in step S206.

The W film thus formed is formed on the silicon oxide film including Si dangling bonds as described above. Accordingly, deposition of the W film occurs with the dangling bonds serving as starting points. Therefore, incubation time as described above is eliminated, and deposition of the W film starts at the same time that $W(CO)_6$ is supplied. Accordingly, substrate processing time is reduced, so that productivity is improved. Further, the effect of improved adhesion of the formed W film to the silicon oxide film is produced, and it was also possible to confirm excellent adhesion in the tape test with no test piece XY being detached from the substrate to be processed Wf or the silicon oxide film.

Fourth Embodiment

As a gas for plasma excitation in substrate pretreatment, besides aforementioned Ar, for instance, an inert gas such as $N_2$ or He, $H_2$, or a combination of these gases may be used. Also in the case of using $N_2$, it is possible to perform substrate processing in the same manner in accordance with the flow shown in FIG. 10.

First, in step S201, the substrate to be processed Wf having a silicon oxide film formed on its surface is placed on the substrate holding table 21A of the substrate processing apparatus 30. The temperature of the substrate to be processed Wf is maintained at 400° C. by the heater 21a, and substrate processing is started.

Next, in step S202, the valve 26 of the substrate processing apparatus 30 is opened so that 50 sccm of an inert gas used for substrate pretreatment, such as $N_2$, is introduced. Then, in step S203, plasma is excited by applying a high frequency from the high frequency application device 27 at a pressure of 0.5 Torr. Substrate pretreatment is performed holding, for 60 seconds, this state where the plasma is excited. In this case, nitrogen ions generated by the plasma collide with the silicon oxide film formed on the surface of the substrate to be processed Wf, so that Si—O bonds are broken in a part. In the part, Si dangling bonds are formed. The dangling bonds serve as starting points in subsequent deposition of a W film, so that it is possible to reduce incubation time in depositing the W film. Further, since bonding with Si is strengthened, it is also possible to improve the adhesion of the W film to the silicon oxide film.

When the substrate pretreatment is thus completed, the substrate to be processed Wf is transferred to the CVD apparatus 10. The substrate to be processed Wf is placed on the substrate holding table 11A, and is maintained at 420° C. by the heater 11a.

Next, in step S204, the mass flow rate controller 15 is controlled with the system controller 16 so that an Ar carrier gas is supplied at a flow rate of 300 SCCM to the bubbler 14 maintained at a temperature of 45° C.

As a result, the same supersaturation state of $W(CO)_6$ molecules as in the case of normal thermal CVD occurs in a space near the silicon oxide film formed on the surface of the substrate to be processed Wf, and in step S205, a W film grows on the substrate Wf so as to cover the silicon oxide film at a film formation rate of 2.8 nm/min.

Then, after deposition of a desired W film is completed, the substrate processing ends in step S206.

Similarly, also in this embodiment, incubation time at the time of W film deposition is eliminated, and deposition of a W film starts at the same time that $W(CO)_6$ is supplied. Accordingly, substrate processing time is reduced, so that productivity is improved. Further, the effect of improved adhesion of the formed W film to the silicon oxide film is produced, and it was also possible to confirm excellent adhesion in the tape test with no test piece XY being detached from the substrate to be processed Wf or the silicon oxide film.

Fifth Embodiment

Further, for instance, a mixture of aforementioned Ar and $N_2$ may be used as a substrate pretreatment gas, and the substrate processing shown in FIG. 10 may be performed in the same manner.

First, in step S201, the substrate to be processed Wf having a silicon oxide film formed on its surface is placed on the substrate holding table 21A of the substrate processing apparatus 30. The temperature of the substrate to be processed Wf is maintained at 390° C. by the heater 21a, and substrate processing is started.

Next, in step S202, the valve 26 of the substrate processing apparatus 30 is opened so that inert gases used for substrate pretreatment, such as 100 sccm of Ar and 50 sccm of $N_2$, are introduced. Then, in step S203, plasma is excited by applying a high frequency from the high frequency application device 27 at a pressure of 0.15 Torr. Substrate pretreatment is performed holding, for 90 seconds, this state where the plasma is excited. In this case, nitrogen ions and Ar ions or nitrogen radicals and Ar radicals generated by the plasma collide with the silicon oxide film formed on the surface of the substrate to be processed Wf, so that Si—O bonds are broken in a part. In the part, Si dangling bonds are formed. The dangling bonds serve as starting points in subsequent deposition of a W film, so that it is possible to reduce incubation time in depositing the W film. Further, since bonding with Si is strengthened, it is also possible to improve the adhesion of the W film to the silicon oxide film.

Next, in step S204, the mass flow rate controller 15 is controlled with the system controller 16 so that an Ar carrier gas is supplied at a flow rate of 300 SCCM to the bubbler 14 maintained at a temperature of 40° C.

As a result, the same supersaturation state of $W(CO)_6$ molecules as in the case of normal thermal CVD occurs in a space near the silicon oxide film formed on the surface of the substrate to be processed Wf, and in step S205, a W film grows on the substrate Wf so as to cover the silicon oxide film at a film formation rate of 2.6 nm/min.

Then, after deposition of a desired W film is completed, the substrate processing ends in step S206.

Similarly, also in this embodiment, incubation time at the time of W film deposition is eliminated, and deposition of a W film starts at the same time that $W(CO)_6$ is supplied. Accordingly, substrate processing time is reduced, so that productivity is improved. Further, the effect of improved adhesion of the formed W film to the silicon oxide film is produced, and it was also possible to confirm excellent adhesion in the tape test with no test piece XY being detached from the substrate to be processed Wf or the silicon oxide film.

Besides aforementioned Ar and $N_2$, He, Xe, and Kr are usable as inert gases thus usable for substrate pretreatment, and the above-described effects of reduced incubation time and improved adhesion are achieved. Further, the same effects as in the case of using the above-described inert gases can also be achieved in the case of using $H_2$, apart from the inert gases.

Sixth Embodiment

Further, in the case of performing the above-described plasma processing, plasma processing using, for instance, an organometallic gas, apart from the inert gases and $H_2$, may be performed in substrate pretreatment. When plasma processing using an organometallic gas is performed, the organometallic gas is adsorbed and decomposed with efficiency so that formation of nuclei serving as starting points of W film deposition occurs easily compared with the case of no plasma application.

A substrate processing method based on FIG. 10 using the plasma of an organometallic gas is shown below.

First, in step S201, the substrate to be processed Wf having a silicon oxide film formed on its surface is placed on the substrate holding table 21A of the substrate processing apparatus 30. The temperature of the substrate to be processed Wf is maintained at 380° C. by the heater 21a, and substrate processing is started.

Next, in step S202, the valve 26 of the substrate processing apparatus 30 is opened so that 30 sccm of an organometallic gas used for substrate pretreatment, such as TDMAT (Ti[N(CH$_3$)$_2$]$_4$), is introduced together with dilute Ar gas. Then, in step S203, plasma is excited by applying a high frequency from the high frequency application device 27 at a pressure of 0.3 Torr. Substrate pretreatment is performed holding, for 60 seconds, this state where the plasma is excited. In this case, since Ti easily reacts with the base silicon oxide film, TDMAT is adsorbed on the surface of the silicon oxide film and decomposed. As a result, nuclei for W film formation to be performed in the next process are formed, thus producing the effect of facilitating W film deposition. Further, the reaction of Ti with the silicon oxide film also improves adhesion. Since Ti has low resistance, it is possible to keep the resistance of a formed film low.

Further, in this case, use of an organometallic gas including boron as a gas to be plasma-excited and used facilitates formation of nuclei serving as starting points of deposition at the time of deposition of a W film. Further, its resistance is low even when it remains inside the film. Accordingly, it is useful as a substrate pretreatment gas.

When the substrate pretreatment is thus completed, the substrate to be processed Wf is transferred to the CVD apparatus 10. The substrate to be processed Wf is placed on the substrate holding table 11A, and is maintained at 420° C. by the heater 11a.

Next, in step S204, the mass flow rate controller 15 is controlled with the system controller 16 so that an Ar carrier gas is supplied at a flow rate of 300 SCCM to the bubbler 14 maintained at a temperature of 45° C.

As a result, the same supersaturation state of W(CO)$_6$ molecules as in the case of normal thermal CVD occurs in a space near the silicon oxide film formed on the surface of the substrate to be processed Wf, and in step S205, a W film grows on the substrate Wf so as to cover the silicon oxide film at a film formation rate of 3.3 nm/min.

Then, after deposition of a desired W film is completed, the substrate processing ends in step S206.

The W film thus formed has nuclei including Ti formed as described above, and deposition of the W film occurs with the nuclei serving as starting points. Therefore, incubation time as described above is eliminated, so that deposition of the W film starts at the same time that W(CO)$_6$ is supplied. Accordingly, substrate processing time is reduced, so that productivity is improved. Further, formation of the nuclei produces the effect of improved adhesion of the formed W film to the silicon oxide film. It was also possible to confirm excellent adhesion in the tape test with no test piece XY being detached from the substrate to be processed Wf or the silicon oxide film.

In this embodiment, TDMAT (Ti[N(CH$_3$)$_2$]$_4$) is used as an organometallic gas, but other organometallic gases are usable. For instance, TDEAT (Ti[N(C$_2$H$_5$)$_2$]$_4$) may be used as organic Ti gas, and the same effects as in this embodiment can be achieved. Further, in the case of using a metal carbonyl compound gas, for instance, any of W(CO)$_6$, Mo(CO)$_6$, Co$_2$(CO)$_8$, Ni(CO)$_4$, Cr(CO)$_6$, V(CO)$_6$, Ru$_3$(CO)$_{12}$, Rh$_4$(CO)$_{12}$, Re$_2$(CO)$_{10}$, Os$_3$(CO)$_{12}$, Mn$_2$(CO)$_{12}$, and Ir$_4$(CO)$_{12}$, the effects of reduced incubation time and improved adhesion can be achieved as in the case of this embodiment. For instance, in the case of depositing a W film using W(CO)$_6$ as in this embodiment, the same effects can also be achieved by performing plasma processing using W(CO)$_6$ itself before deposition of the W film.

Seventh Embodiment

The substrate processing methods shown in the third through sixth embodiments are enabled to perform substrate pretreatment and W film deposition successively in a substrate processing apparatus 10B shown below in FIG. 11.

Figure 11:
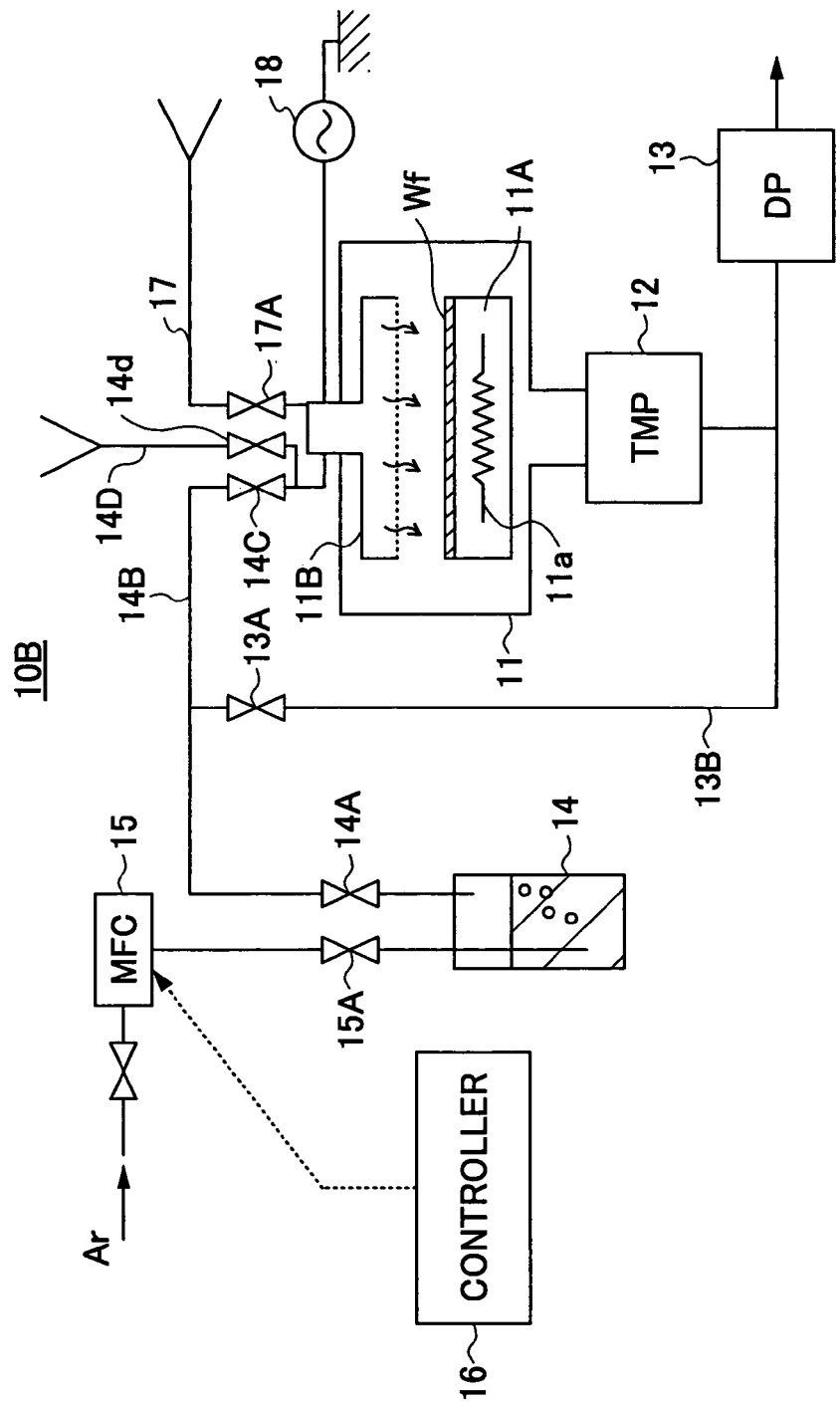
FIG. 11 is a diagram showing a configuration of a substrate processing apparatus performing substrate processing according to the present invention.

FIG. 11 shows the substrate processing apparatus 10B that can successively perform the substrate pretreatment and W film deposition shown in FIG. 10. In the drawing, the parts described above are assigned the same reference numerals, and a description thereof is omitted.

Referring to FIG. 11, the substrate processing apparatus 10B is formed by connecting a high frequency application device 18 to the shower head 11B of the substrate processing apparatus 10A. The line 17, which is connected to a gas supply source not graphically illustrated, supplies gas necessary for substrate pretreatment to the substrate processing apparatus 10B through the shower head 11B. This structure is equal to that of the substrate processing apparatus 10A.

Next, a specific case of performing the substrate processing method shown in FIG. 10 using the substrate processing apparatus 10B is shown below.

First, in step S201, the substrate to be processed Wf having a silicon oxide film formed on its surface is placed on the substrate holding table 11A of the substrate processing apparatus 10B. The temperature of the substrate to be processed Wf is maintained at 395° C. by the heater 11a, and substrate processing is started.

Next, in step S202, the valve 17A of the substrate processing apparatus 10B is opened so that 500 sccm of an inert gas used for substrate pretreatment, such as Ar, is introduced. Then, in step S203, plasma is excited by applying a high frequency from the high frequency application device 18 at a pressure of 0.5 Torr. Substrate pretreatment is performed holding, for 120 seconds, this state where the plasma is excited. In this case, Ar$^+$ (Ar ions) generated by the plasma collides with the silicon oxide film formed on the surface of the substrate to be processed Wf, so that Si—O bonds are broken in a part. In the part, Si dangling bonds are formed. The dangling bonds serve as starting points in subsequent deposition of a W film, so that it is possible to reduce incubation time in depositing the W film. Further, since bonding with Si is strengthened, it is also possible to improve the adhesion of the W film to the silicon oxide film.

When the substrate pretreatment is thus completed, supply of Ar, which is a substrate pretreatment gas, is stopped, and the processing container 11 is evacuated. The substrate to be processed Wf is maintained at 415° C. by the heater 11a.

Next, in step S204, the mass flow rate controller 15 is controlled with the system controller 16 so that an Ar carrier gas is supplied at a flow rate of 300 SCCM to the bubbler 14 maintained at a temperature of 25° C.

As a result, the same supersaturation state of W(CO)$_6$ molecules as in the case of normal thermal CVD occurs in a space near the silicon oxide film formed on the surface of the substrate to be processed Wf, and in step S205, a W film grows on the substrate Wf so as to cover the silicon oxide film at a film formation rate of 2.4 nm/min.

Then, after deposition of a desired W film is completed, the substrate processing ends in step S206.

Thus, the same effects of reduced incubation time and improved adhesion can also be achieved in the case of successively performing substrate pretreatment through W film deposition in the substrate processing apparatus 10B. Further, as described above in the third through sixth embodiments, it is possible to use an inert gas other than Ar, such as He, $N_2$, Xe, or Kr, or $H_2$, as a substrate pretreatment gas. Further, TDEAT $(Ti[N(C_2H_5)_2]_4)$ or TDMAT $(Ti[N(CH_3)_2]_4)$, which is organic Ti gas, may be used as an organometallic gas. Further, also in the case of using a metal carbonyl compound gas, such as $W(CO)_6$, $Co(CO)_6$, $Mo(CO)_6$, or $[Rh(CO)_4]_4$, the effects of reduced incubation time and improved adhesion can be achieved as in the case of this embodiment. For instance, in the case of depositing a W film using $W(CO)_6$ as in this embodiment, the same effects can also be achieved by performing plasma processing using $W(CO)_6$ itself before deposition of the W film.

Eighth Embodiment

Figure 12:
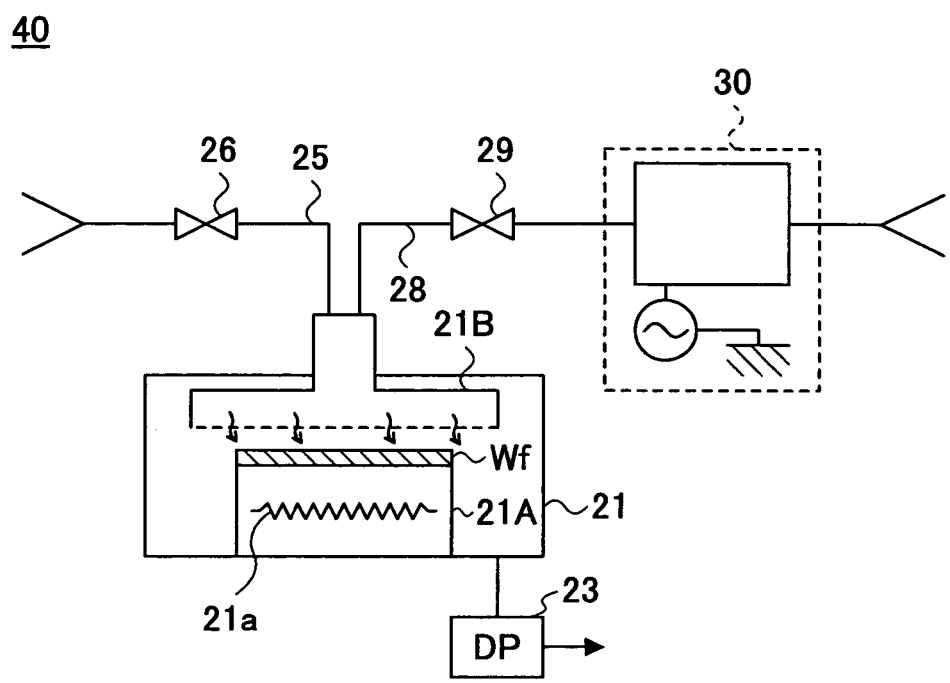
FIG. 12 is a diagram showing a configuration of a substrate processing apparatus performing substrate processing according to the present invention.

Next, as an eighth embodiment, a substrate processing apparatus 40 is shown in FIG. 12 as an example substrate processing apparatus performing substrate pretreatment. In the drawing, the parts described above are assigned the same reference numerals, and a description thereof is omitted.

Referring to FIG. 12, the substrate processing apparatus 40 is formed by providing a line 28 with a valve 29 to the shower head 21B of the substrate processing apparatus 20 and connecting a remote plasma source 30 to the line 28. The remote plasma source 30 is structured so as to introduce gas supplied from a substrate pretreatment gas supply source, not graphically illustrated, to which the line 28 is connected; excite plasma in the remote plasma source 30 by applying a high frequency; and supply radicals generated from the substrate pretreatment gas from the line 28 through the shower head 21B into the processing container 21.

Next, a specific substrate processing method using the substrate processing apparatus 40 and the CVD apparatus 10 is shown below in FIG. 13.

First, in step S301, the substrate to be processed Wf having a silicon oxide film formed on its surface is placed on the substrate holding table 21A of the substrate processing apparatus 40. The temperature of the substrate to be processed Wf is maintained at 385° C. by the heater 21a, and substrate processing is started.

Next, in step S302, the valve 29 of the line 28 is opened so that 500 sccm of a substrate pretreatment gas such as Xe is supplied through the remote plasma source 30. At this point, plasma excitation occurs in the remote plasma source 30, and Xe is excited into a plasma and supplied to the processing container 21, so that the pressure inside the processing container 21 becomes 0.5 Torr.

Next, in step S303, substrate pretreatment is performed holding, for 60 seconds, this state where the plasma-excited Xe is supplied. In this case, the organic contamination of the silicon oxide film formed on the surface of the substrate to be processed Wf is removed by the plasma-excited Xe. This makes it possible to reduce incubation time in depositing a W film. Further, since bonding with Si is strengthened, it is also possible to improve the adhesion of the W film to the silicon oxide film.

When the substrate pretreatment is thus completed, the substrate to be processed Wf is transferred to the CVD apparatus 10. The substrate to be processed Wf is placed on the substrate holding table 11A, and is maintained at 412° C. by the heater 11a.

Next, in step S304, the mass flow rate controller 15 is controlled with the system controller 16 so that an Ar carrier gas is supplied at a flow rate of 300 SCCM to the bubbler 14 maintained at a temperature of 40° C.

As a result, the same supersaturation state of $W(CO)_6$ molecules as in the case of normal thermal CVD occurs in a space near the silicon oxide film formed on the surface of the substrate to be processed Wf, and in step S305, a W film grows on the substrate Wf so as to cover the silicon oxide film at a film formation rate of 2.7 nm/min.

Then, after deposition of a desired W film is completed, the substrate processing ends in step S306.

Similarly, also in this embodiment, incubation time at the time of W film deposition is eliminated, and deposition of a W film starts at the same time that $W(CO)_6$ is supplied. Accordingly, substrate processing time is reduced, so that productivity is improved. Further, the effect of improved adhesion of the formed W film to the silicon oxide film is produced, and it was also possible to confirm excellent adhesion in the tape test with no test piece XY being detached from the substrate to be processed Wf or the silicon oxide film.

Ninth Embodiment

Further, an embodiment in the case of using $H_2$ as a substrate pretreatment gas in the same manner is shown below.

First, in step S301, the substrate to be processed Wf having a silicon oxide film formed on its surface is placed on the substrate holding table 21A of the substrate processing apparatus 40. The temperature of the substrate to be processed Wf is maintained at 390° C. by the heater 21a, and substrate processing is started.

Next, in step S302, the valve 29 of the line 28 is opened so that 500 sccm of a substrate pretreatment gas such as $H_2$ is supplied through the remote plasma source 30. At this point, plasma excitation occurs in the remote plasma source 30, and $H_2$ is excited into a plasma and supplied to the processing container 21, so that the pressure inside the processing container 21 becomes 0.5 Torr.

Next, in step S303, substrate pretreatment is performed holding, for 60 seconds, this state where the plasma-excited $H_2$ is supplied. In this case, the organic contamination of the silicon oxide film formed on the surface of the substrate to be processed Wf is removed by the plasma-excited $H_2$. This makes it possible to reduce incubation time in depositing a W film. Further, since bonding with Si is strengthened, it is also possible to improve the adhesion of the W film to the silicon oxide film.

When the substrate pretreatment is thus completed, the substrate to be processed Wf is transferred to the CVD apparatus 10. The substrate to be processed Wf is placed on the substrate holding table 11A, and is maintained at 420° C. by the heater 11a.

Next, in step S304, the mass flow rate controller 15 is controlled with the system controller 16 so that an Ar carrier gas is supplied at a flow rate of 300 SCCM to the bubbler 14 maintained at a temperature of 40° C.

As a result, the same supersaturation state of $W(CO)_6$ molecules as in the case of normal thermal CVD occurs in a space near the silicon oxide film formed on the surface of the substrate to be processed Wf, and in step S305, a W film grows on the substrate Wf so as to cover the silicon oxide film at a film formation rate of 2.9 nm/min.

Then, after deposition of a desired W film is completed, the substrate processing ends in step S306.

Similarly, also in this embodiment, incubation time at the time of W film deposition is eliminated, and deposition of a W film starts at the same time that $W(CO)_6$ is supplied. Accordingly, substrate processing time is reduced, so that productivity is improved. Further, the effect of improved adhesion of the formed W film to the silicon oxide film is produced, and it was also possible to confirm excellent adhesion in the tape test with no test piece XY being detached from the substrate to be processed Wf or the silicon oxide film.

In the eighth and ninth embodiments, Xe and $H_2$ are used as a substrate pretreatment gas. The same effects can also be achieved in the case of using other rare gases such as He, Ar, $N_2$, and Kr.

Tenth Embodiment

Further, in the case of using a remote plasma source as described above, plasma processing using, for instance, an organometallic gas, apart from the inert gas and $H_2$, may be performed in substrate pretreatment. When plasma processing using an organometallic gas is performed, the organometallic gas is adsorbed and decomposed with efficiency so that formation of nuclei serving as starting points of W film deposition occurs easily compared with the case of no plasma application.

A substrate processing method based on FIG. 13 using the plasma of an organometallic gas is shown below.

First, in step S301, the substrate to be processed Wf having a silicon oxide film formed on its surface is placed on the substrate holding table 21A of the substrate processing apparatus 40. The temperature of the substrate to be processed Wf is maintained at 390° C. by the heater 21a, and substrate processing is started.

Next, in step S302, the valve 29 of the line 28 is opened so that 500 sccm of an organometallic gas such as $Mo(CO)_6$, which is a substrate pretreatment gas, and Ar, which is a carrier gas, are supplied through the remote plasma source 30. At this point, plasma excitation occurs in the remote plasma source 30, and the substrate pretreatment gas, which is plasma-excited $Mo(CO)_6$, is supplied to the processing container 21, so that the pressure inside the processing container 21 becomes 0.8 Torr.

Next, in step S303, substrate pretreatment is performed holding, for 60 seconds, this state where the plasma-excited $Mo(CO)_6$ is supplied. In this case, the plasma-excited $Mo(CO)_6$ is adsorbed on the surface of the silicon oxide film and decomposed, so that nuclei for W film formation to be performed in the next process are formed. This facilitates deposition of a W film, and further produces the effect of improved adhesion of the W film to the base silicon oxide film.

When the substrate pretreatment is thus completed, the substrate to be processed Wf is transferred to the CVD apparatus 10. The substrate to be processed Wf is placed on the substrate holding table 11A, and is maintained at 420° C. by the heater 11a.

Next, in step S304, the mass flow rate controller 15 is controlled with the system controller 16 so that an Ar carrier gas is supplied at a flow rate of 300 SCCM to the bubbler 14 maintained at a temperature of 45° C.

As a result, the same supersaturation state of $W(CO)_6$ molecules as in the case of normal thermal CVD occurs in a space near the silicon oxide film formed on the surface of the substrate to be processed Wf, and in step S305, a W film grows on the substrate Wf so as to cover the silicon oxide film at a film formation rate of 3.4 nm/min.

Then, after deposition of a desired W film is completed, the substrate processing ends in step S306.

Deposition of the W film thus formed occurs with the nuclei, formed by $Mo(CO)_6$ adsorbed on the surface of the silicon oxide film and decomposed, serving as starting points. Therefore, incubation time as described above is eliminated, so that deposition of the W film starts at the same time that $W(CO)_6$ is supplied. Accordingly, substrate processing time is reduced, so that productivity is improved. Further, formation of the nuclei produces the effect of improved adhesion of the formed W film to the silicon oxide film. It was also possible to confirm excellent adhesion in the tape test with no test piece XY being detached from the substrate to be processed Wf or the silicon oxide film.

In this embodiment, $Mo(CO)_6$ is used as an organometallic gas. Alternatively, also in the case of using a carbonyl compound gas, for instance, any of $W(CO)_6$, $Co_2(CO)_8$, $Ni(CO)_4$, $Cr(CO)_6$, $V(CO)_6$, $Ru_3(CO)_{12}$, $Rh_4(CO)_{12}$, $Re_2(CO)_{10}$, $Os_3(CO)_{12}$, $Mn_2(CO)_{12}$, and $Ir_4(CO)_{12}$, the effects of reduced incubation time and improved adhesion can be achieved as in the case of this embodiment. For instance, in the case of depositing a W film using $W(CO)_6$ as in this embodiment, the same effects can also be achieved by performing plasma processing using $W(CO)_6$ itself before deposition of the W film. Further, it is also possible to use organic Ti gas such as TDEAT ($Ti[N(C_2H_5)_2]_4$) or TDMAT ($Ti[N(CH_3)_2]_4$) as a substrate pretreatment gas.

11$^{th}$ Embodiment

Further, the substrate processing methods shown in the eighth through tenth embodiments are enabled to perform substrate pretreatment and W film deposition successively in a substrate processing apparatus 10C shown below in FIG. 14.

Figure 13:
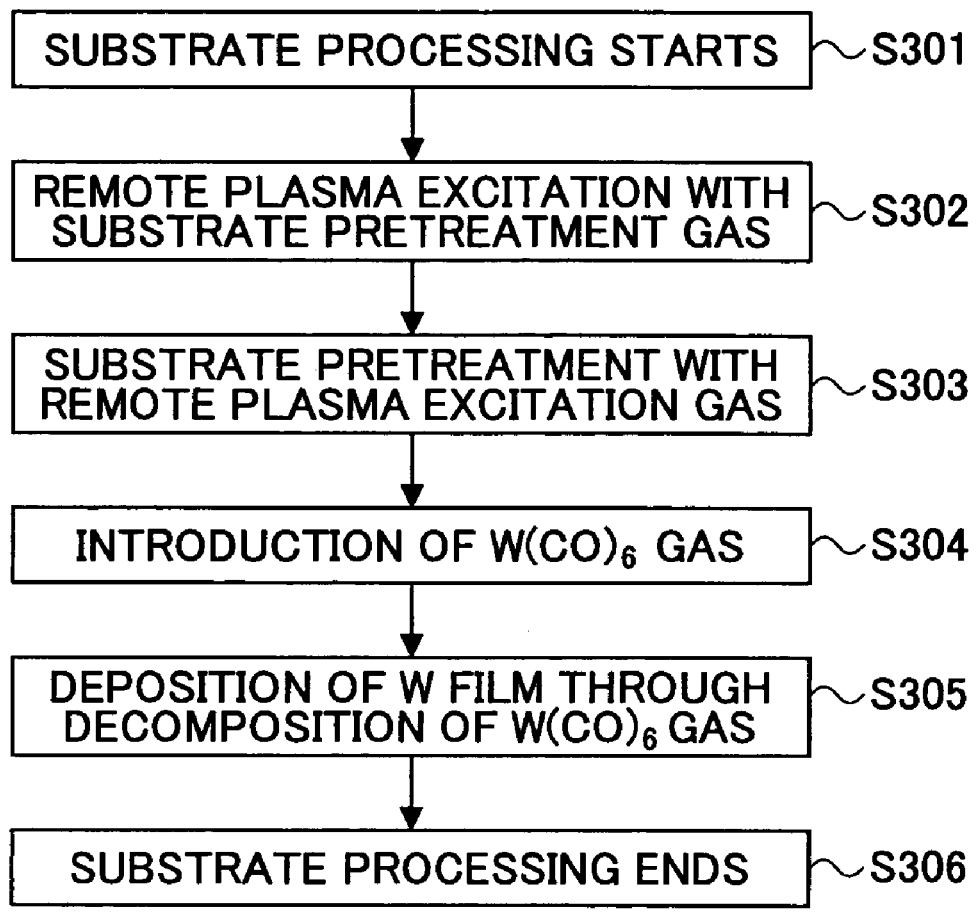
FIG. 13 is a diagram showing a substrate processing method according to the present invention.
Figure 14:
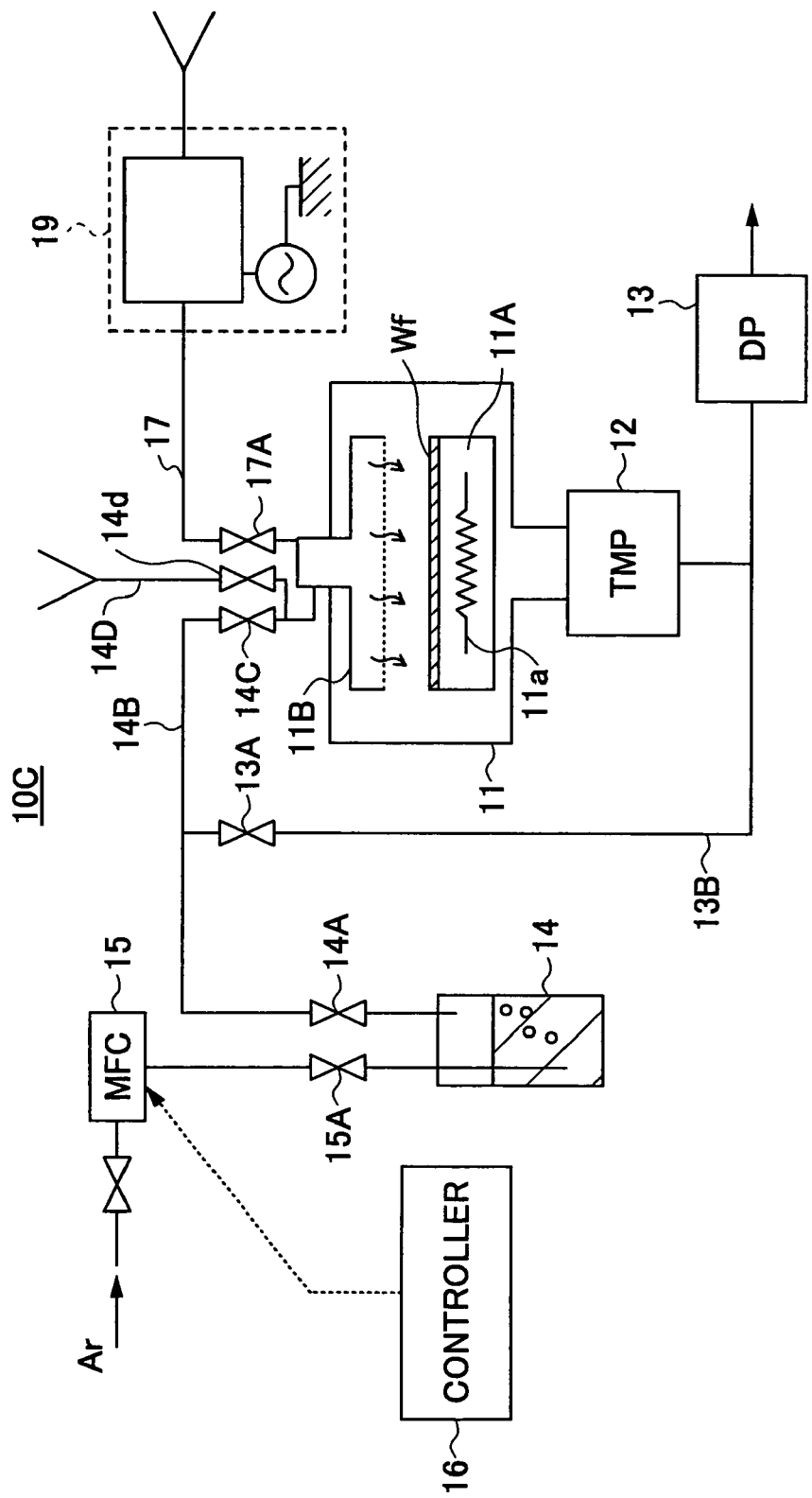
FIG. 14 is a diagram showing a configuration of a substrate processing apparatus performing substrate processing according to the present invention.

FIG. 14 shows the substrate processing apparatus 10C that can successively perform the substrate pretreatment and W film deposition shown in FIG. 13. In the drawing, the parts described above are assigned the same reference numerals, and a description thereof is omitted.

Referring to FIG. 14, the substrate processing apparatus 10C is formed by providing a remote plasma source 19 to the gas line 17 of the substrate processing apparatus 10A. The remote plasma source 19 excites a substrate pretreatment gas supplied from a gas supply source not graphically illustrated to the line 17 into a plasma with a high frequency, and introduces it to the processing container 11.

A specific case of performing the substrate processing method shown in FIG. 13 using the substrate processing apparatus 10C and the CVD apparatus 10 is shown below.

First, in step S301, the substrate to be processed Wf having a silicon oxide film formed on its surface is placed on the substrate holding table 11A of the substrate processing apparatus 10C. The temperature of the substrate to be processed Wf is maintained at 385° C. by the heater 11a, and substrate processing is started.

Next, in step S302, the valve 17A of the line 17 is opened so that 500 sccm of a substrate pretreatment gas such as Xe are supplied through the remote plasma source 19. At this point, plasma excitation occurs in the remote plasma source 19, and Xe is excited into plasma and supplied to the processing container 11, so that the pressure inside the processing container 11 becomes 0.5 Torr.

Next, in step S303, substrate pretreatment is performed holding, for 60 seconds, this state where the plasma-excited Xe is supplied. In this case, the organic contamination of the silicon oxide film formed on the surface of the substrate to be processed Wf is removed by the plasma-excited Xe. This makes it possible to reduce incubation time in depositing a W film. Further, since bonding with Si is strengthened, it is also possible to improve the adhesion of the W film to the silicon oxide film.

When the substrate pretreatment is thus completed, supply of Xe, which is a substrate pretreatment gas, is stopped, and the processing container 11 is evacuated. The substrate to be processed Wf is maintained at 412° C. by the heater 11a.

Next, in step S304, the mass flow rate controller 15 is controlled with the system controller 16 so that an Ar carrier gas is supplied at a flow rate of 300 SCCM to the bubbler 14 maintained at a temperature of 40° C.

As a result, the same supersaturation state of $W(CO)_6$ molecules as in the case of normal thermal CVD occurs in a space near the silicon oxide film formed on the surface of the substrate to be processed Wf, and in step S305, a W film grows on the substrate Wf so as to cover the silicon oxide film at a film formation rate of 2.7 nm/min.

Then, after deposition of a desired W film is completed, the substrate processing ends in step S306.

Similarly, also in this embodiment, incubation time at the time of W film deposition is eliminated, and deposition of a W film starts at the same time that $W(CO)_6$ is supplied. Accordingly, substrate processing time is reduced, so that productivity is improved. Further, the effect of improved adhesion of the formed W film to the silicon oxide film is produced, and it was also possible to confirm excellent adhesion in the tape test with no test piece XY being detached from the substrate to be processed Wf or the silicon oxide film.

In this embodiment, a case of using Xe as a substrate pretreatment gas is shown. However, the same effects as in this embodiment can also be achieved in the case of using other inert gases such as He, Ar, $N_2$, and Kr or $H^2$.

Further, an organometallic gas such as TDEAT ($Ti[N(C_2H_5)_2]_4$) or TDMAT ($Ti[N(CH_3)_2]_4$), which is organic Ti gas, may be used as a substrate pretreatment gas. Further, also in the case of using a metal carbonyl compound gas, for instance, any of $W(CO)_6$, $Mo(CO)_6$, $Co_2(CO)_8$, $Ni(CO)_4$, $Cr(CO)_6$, $V(CO)_6$, $Ru_3(CO)_{12}$, $Rh_4(CO)_{12}$, $Re_2(CO)_{10}$, $Os_3(CO)_{12}$, $Mn_2(CO)_{12}$, and $Ir_4(CO)_{12}$, the effects of reduced incubation time and improved adhesion can be achieved as in the case of this embodiment. For instance, in the case of depositing a W film using $W(CO)_6$ as in this embodiment, the same effects can also be achieved by performing plasma processing using $W(CO)_6$ itself before deposition of the W film.

Further, the above description is given of substrate processing methods in the case of forming a W film using $W(CO)_6$. However, the present invention does not limit a material gas and a film to be formed to this. For instance, in the case of forming any of a Mo film, Co film, Ni film, Cr film, V film, Ru film, Rh film, Re film, Os film, Mn film, and Ir film using any of $Mo(CO)_6$, $Co_2(CO)_8$, $Ni(CO)_4$, $Cr(CO)_6$, $V(CO)_6$, $Ru_3(CO)_{12}$, $Rh_4(CO)_{12}$, $Re_2(CO)_{10}$, $Os_3(CO)_{12}$, $Mn_2(CO)_{12}$, and $Ir_4(CO)_{12}$ as a material gas, the present invention is also applicable as in the case of forming the W film.

According to the present invention, in a method of forming a metal film by CVD using a metal carbonyl material, by introducing a reactive gas into a space near the surface of a substrate to be processed, it is possible to improve substrate processing efficiency by reducing incubation time at the time of film formation, and further, the adhesion of the formed film to a base film is improved.

A description is given above of preferred embodiments of the present invention. However, the present invention is not limited to the specifically disclosed embodiments, and variations and modifications may be made without departing from the scope of the present invention.

What is claimed is:

1. A film formation method, comprising the steps of:
   (a) introducing one of an organic titanium gas and a boron compound gas into a space near a silicon oxide film formed on a surface of a substrate to be processed, and plasma-exciting the one of the organic titanium gas and the boron compound gas; and
   (b) introducing a gaseous phase material including a metal carbonyl compound into the space on the silicon oxide film formed on the surface of the substrate to be processed, and depositing a metal film on the silicon oxide film after said step (a),
   wherein said step (a) forms a nucleus including one of titanium and boron on the silicon oxide film formed on the surface of the substrate to be processed,
   the metal film is in direct physical contact with the silicon oxide film, and
   wherein at least one gas selected from the group consisting of TDEAT ($Ti[N(C_2H_5)_2]_4$), TDMAT ($Ti[N(CH_3)_2]_4$), $BF_3$, and $B(C_2H_5)_3$, is introduced into the space in (a).

2. The film formation method as claimed in claim 1, wherein at least one selected from the group consisting of TDEAT ($Ti[N(C_2H_5)_2]_4$) and TDMAT ($Ti[N(CH_3)_2]_4$) is introduced into the space in (a).

3. The method as claimed in claim 1, wherein at least one boron gas selected from the group consisting of $BF_3$ and $B(C_2H_5)_3$ is introduced in the space.

4. A film formation method, comprising the steps of:
   (a) introducing one of an organic titanium gas and a boron compound gas into a space near a silicon oxide film formed on a surface of a substrate to be processed, and plasma-exciting the one of the organic titanium gas and the boron compound gas; and
   (b) introducing a gaseous phase material including a metal carbonyl compound into the space on the silicon oxide film formed on the surface of the substrate to be processed, and depositing a metal film on the silicon oxide film after said step (a),
   wherein said step (a) forms a nucleus including one of titanium and boron on the silicon oxide film formed on the surface of the substrate to be processed;
   the metal film is deposited on the silicon oxide film so as to cover the silicon oxide film with the nucleus providing a starting point for the deposition of the metal film,
   the metal film is in direct physical contact with the silicon oxide film, and
   wherein at least one gas selected from the group consisting of TDEAT ($Ti[N(C_2H_5)_2]_4$), TDMAT ($Ti[N(CH_3)_2]_4$), $BF_3$, and $B(C_2H_5)_3$, is introduced into the space in (a).

5. The method as claimed in claim 4, wherein at least one boron gas selected from the group consisting of $BF_3$ and $B(C_2H_5)_3$ is introduced in the space.

6. A method of forming a metal film using a metal carbonyl compound as a material, comprising:
   (a) introducing one of an organic titanium gas and a boron compound gas into a space near a silicon oxide film formed on a surface of a substrate to be processed; and
   (b) introducing a gaseous phase material including the metal carbonyl compound into the space on the silicon oxide film formed on the surface of the substrate to be processed, and depositing the metal film on the silicon oxide film after said step (a), wherein said step (a) forms a nucleus including one of titanium and boron on the silicon oxide film formed on the surface of the substrate to be processed, wherein the metal film is in direct physical contact with the silicon oxide film, and wherein at least one gas selected from the group consisting of TDEAT ($Ti[N(C_2H_5)_2]_4$), TDMAT ($Ti[N(CH_3)_2]_4$), $BF_3$, and $B(C_2H_5)_3$, is introduced into the space in (a).

7. The method as claimed in claim 6, wherein at least one selected from the group consisting of TDEAT ($Ti[N(C_2H_5)_2]_4$) and TDMAT ($Ti[N(CH_3)_2]_4$), is introduced in to the space in (a).

8. The method as claimed in claim 6, wherein the introducing (a) is performed in a first processing container in which the substrate to be processed is processed, and the introducing (b) is performed in a-second processing container separated from the first processing container.

9. The method as claimed in claim 6, wherein the introducing (a) and the introducing (b) are executed successively in a same processing container.

10. The method as claimed in claim 6, wherein the metal carbonyl compound includes at least one of $W(CO)_6$, $Mo(CO)_6$, $Co_2(CO)_8$, $Ni(CO)_4$, $Cr(CO)_6$, $V(CO)_6$, $Ru_3(CO)_{12}$, $Rh_4(CO)_{12}$, $Re_2(CO)_{10}$, $Os_3(CO)_{12}$, $Mn_2(CO)_{12}$, and $Ir_4(CO)_{12}$.

11. The method as claimed in claim 6, wherein at least one boron gas selected from the group consisting of $BF_3$ and $B(C_2H_5)_3$ is introduced in the space.

* * * * *